United States Patent [19]

Meyer

[11] Patent Number: 4,575,708
[45] Date of Patent: Mar. 11, 1986

[54] DECODER OF A DATA FROM A SUBGROUP OF P DATA BELONGING TO A GROUP OF N DATA

[75] Inventor: Jacques Meyer, Grenoble, France

[73] Assignee: Societe pour l'Etude et la Fabrication de Circuits Integres Speciaux E.F.C.I.S., Grenoble, France

[21] Appl. No.: 591,605

[22] Filed: Mar. 20, 1984

[30] Foreign Application Priority Data

Mar. 25, 1983 [FR] France ................................ 83 04977

[51] Int. Cl.⁴ .............................................. G06F 5/00
[52] U.S. Cl. .......................... 340/347 DD; 340/825.79
[58] Field of Search ................ 340/723, 724, 347 DD; 340/825.79–825.93; 382/48, 56; 377/67; 364/900

[56] References Cited

FOREIGN PATENT DOCUMENTS 0065460 11/1982 France .

OTHER PUBLICATIONS

IBM Technical Disclosure Bulletin, vol. 20, No. 8, Jan. 1978, New York (U.S., G. Krieg: "Arrangement for Decompressing Compressed Data".

Primary Examiner—Charles D. Miller
Attorney, Agent, or Firm—Roland Plottel

[57] ABSTRACT

Being given the number among P of a data, an attempt is made to find the number among N of said data in a group of N data incorporating P selected data. The sequence numbers of these P data appear in a register having N locations and the sequence number of the chosen data among P appears in a second register with P locations. The locations of the second register are connected to the rows of a switching circuit, each of these rows having N cells, which connect the input of one cell to the following cell of the same rank or to the following cell of the lower rank, as a function of the content of the corresponding location of the first register. Thus, at the outputs of the columns there are signals, whereof only one is at a level different from the others and corresponding to the number j among N of the chosen data.

3 Claims, 5 Drawing Figures

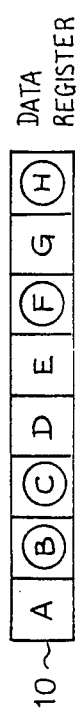
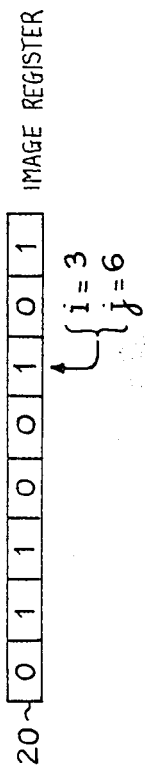
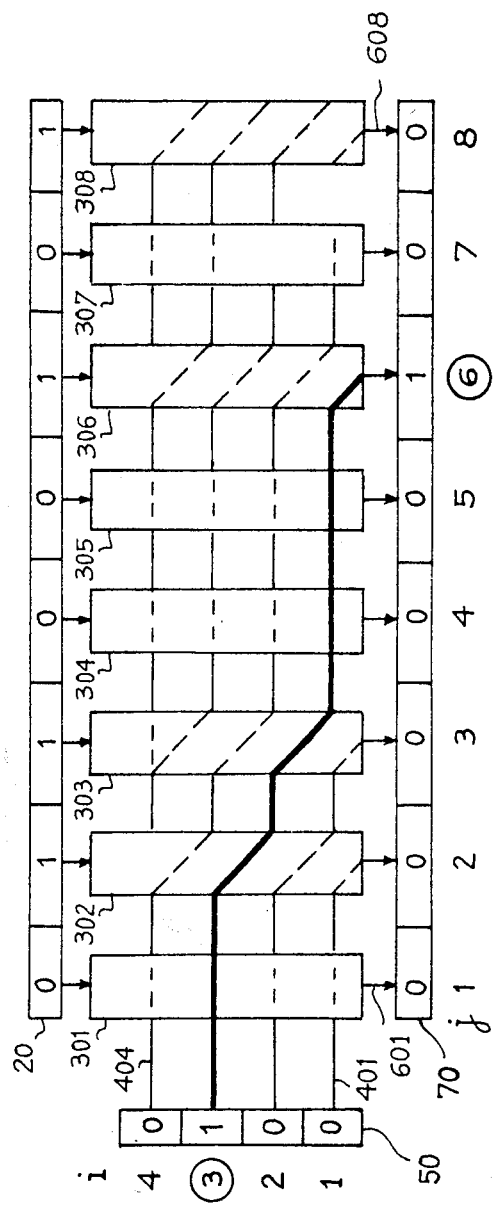
Fig.1
Fig.2

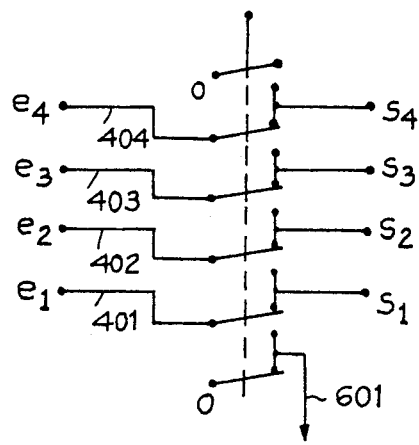
Fig.3
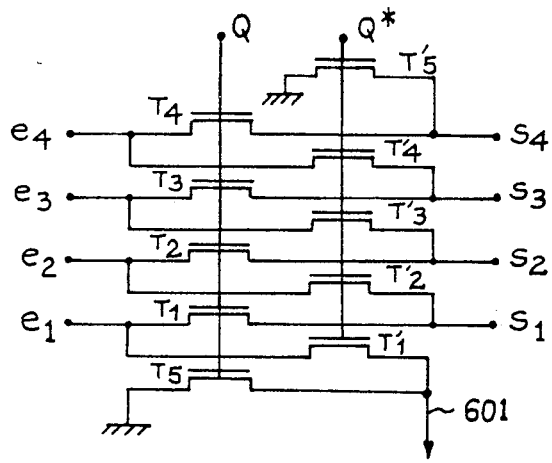
Fig.4
Fig.5
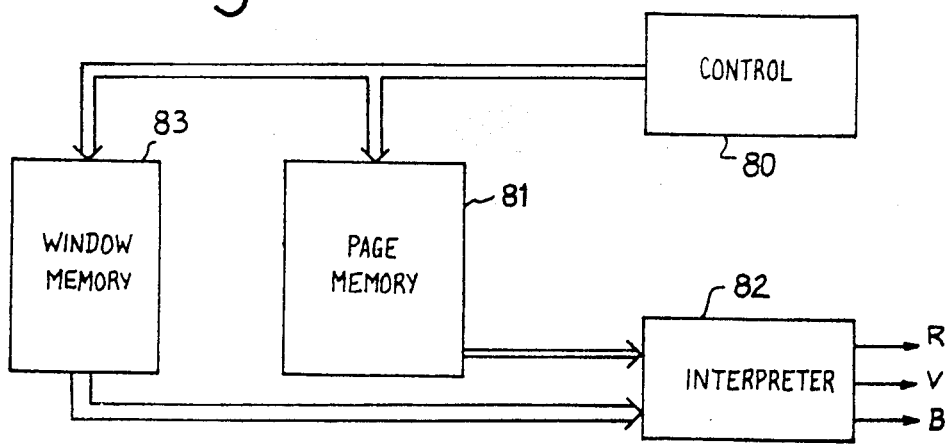

DECODER OF A DATA FROM A SUBGROUP OF P DATA BELONGING TO A GROUP OF N DATA

BACKGROUND OF THE INVENTION

The present invention relates in general terms to a decoder making it possible to select a predetermined data from a group of P data the latter forming part of a larger group of N data. The present invention is more particularly used in alphanumeric and graphic display systems, but can also be used for data decoding in numerous other cases.

In the following description of the prior art and the present invention, consideration will be given to the case where $N=2^n$ and in which $P=2^p$, but P and N can be of a random nature if P is equal to or smaller than N.

The present invention is relevant for decoders in the special case where it is attempted to carry out real time decoding, which e.g. excludes the use of counters which sequentially scan a register in order to determine the location of the first or nth "1" contained in said register. In numerous cases in informatics, an attempt is made to find a data forming part of a group of N data. For this purpose, it is appropriate to provide a memory or register containing said N data and addressing said memory. This addressing must correspond to an n bit word, if $N=2^n$. After having recorded a succession of events corresponding to the successive incidence of the various data, the succession of n bit words corresponding to the data addresses will be recorded. If it is wished to store a large sequence of data, or more specifically data addresses, it is desirable for said addresses to be as short as possible.

There is at least one case where it is possible to shorten the address of the address word to a value below n. This is the case where, during a given sequence, the chosen data is not a random one from among N data, but belongs to a subgroup P of said N data. Thus, during this sequence, it is possible to designate the sought data by its sequence number or its address from among the P data, it is possible to use an address of only p bits if $P=2^p$. It is then necessary to carry out the correlation between the address or sequence number from among the P data and the address or the sequence number among the N data. In other words, on the basis of the number from among the P data, it is necessary to determine the number from among the N data.

For solving this problem, using conventional and immediate informatics methods, consideration will be given to whether there are $2^N$ combinations of N data and it is then necessary to use a decoder having a read-only memory or a programmable logic network having a capacity or number of nodes equal to $p.n.2^N$.

SUMMARY OF THE INVENTION

The present invention aims at providing a particularly simple decoder, which does not require the use of a memory with such a large capacity.

The present invention therefore specifically relates to a decoder for the real time decoding of a data belonging to a subgroup of P data, themselves forming part of a group of N data with P being lower than N and comprising a first register with N locations, each of these locations corresponding in ordered manner to one of the data, the presence o absence of each data being indicated by the binary state of the corresponding location, P data from among the N data being present; a second register with P locations, whereof one, corresponding to the number among P of the data to be decoded, is in a different binary state to that of the others; a switching circuit with P rows and N columns, each row - column intersection being occupied by a cell incorporating a switching control terminal, an input and two outputs, the first output being connected to the input of the following cell of the same row, the second output being connected to the input of the following cell of the following row, except with respect to the cells of the lowest rank row for which the second input is connected to an output terminal; the P inputs of the cells of the first column being connected to the locations of the second register; the switching controls of all the cells of one column being connected to a location of the first register; so that on the output terminals of the cells of the lowest rank row a different binary state in the column from among the N which corresponds to the data among the P fixed in the second register.

Special embodiments of the switching circuit cells, as well as an application of the present invention to an alphanumeric or graphic symbol display system will be described in greater detail hereinafter relative to the drawings.

BRIEF DESCRIPTION OF THE DRAWINGS

FIG. 1 shows various registers and will be used as a basis for the general description of the aims of the invention.

FIG. 2 shows in block form a decoder according to the invention.

FIG. 3 diagrammatically shows in the form of relays, the cells of a decoder according to the invention.

FIG. 4 diagrammatically shows an embodiment in the form of MOS transistors of cells of a decoder according to the invention.

FIG. 5 illustrates an application of a decoder according to the invention to an alphanumeric or graphic display circuit.

DETAILED DESCRIPTION OF THE INVENTION

Hereinafter, the example will be used in which the number $N=8$ ($n=3$) and which the number $P=4$ ($p=2$). Having a group of eight (N) objects or data or words, designated by the letters A to H and brought together in a data register or memory 0, an attempt will be made to designate from among these eight data, four of them (P), e.g. data B, C, F and H. For this purpose, with the data register 10 is associated an image register 20 also having N (eight) locations, into which is introduced a different binary state depending on whether or not the corresponding data belongs to the selected subgroup. Thus, binary state 0 is associated with data A, D, E, G and binary state 1 with data B, C, F and H. An attempt will be made to identify letter F by identifying it by its sequence number (i) in the subgroup of P (four) data present, i.e. the number three in the subgroup of data B, C, F and H. The decoder must make it possible to convert this indication (i) of the sequence number in the subgroup into an indication (j) of the sequence number in the group of N data appearing in image register 20, said second sequence number being, in the illustrated case, the number 6 of letter F.

The decoder according to the invention comprises a group of switching cells arranged in accordance with P rows and N columns. In FIG. 2, the P cells of the same column are not individually shown. Only one is shown, in the form of blocks (301 to 308), the N (eight) groups of cells constituting the columns of the switching circuit. Realisations of these blocks will be described relative to FIGS. 3 and 4. The P cells of each of the respective columns (301 to 308) are controlled by a respective output of the aforementioned image register 20. The input (401 to 404) of each row (i.e. the inputs of the cells of the first column) receives a signal in a first or second binary state, shown in register 50, the second binary state, e.g. a 1, corresponding to the indication of the number among P of the data which it is wished to identify. In other words, the ith location of register 50 is in state 1, i being the number among P of the sought data. Each cell of a column transmits the signal of its input to the input of the cell of the following column and of the same row, if the cells of this column correspond to a content 0 in register 20. If the content of the location of image register 20 corresponding to a column of cells is 1, all the cells of this column will have the effect of transmitting the signal at their input to the input of the cells of the following column, but of the lower rank row. The lower cell of each column is connected to an output terminal (601 to 608). The input signal of the last cell is directed towards the output terminal, if the control of said cell is at 1 and towards the corresponding cell of the following column if the control signal of said cell is at 0.

FIG. 2 shows the case where an attempt is being made to identify the number j among N of a data, whose number i among P is equal to 3. Thus, in register 50, the third location contains a 1 and the other locations contain a 0. The first cell encountered is controlled by a 0 of register 20 and transmits its output to the input of the following cell of the same rank of column 202. However, at columns 302 and 303, which are controlled by 1 in register 20, the input signal is transmitted to the cell of the following column of a lower rank. In the cells of columns 304 and 305 controlled by 0, there is no output signal displacement compared with the input signal. At the lower cell of column 306, which is controlled by a 1, the input signal is transmitted to the output terminal. Thus, at output 601 to 608, there is a succession of 0, then a 1 at the location corresponding to the selected data. The position of this 1 corresponds to the number j among N of the selected data. In the represented example, the third among the P data is the sixth among the N data. The output terminals 601 to 608 are shown as being connected to a register 70 and the latter can normally be the same as the data register 10 of FIG. 1.

The cells of FIG. 2 can be in the form of relays, as shown in FIG. 3 for the cells of one and the same column, e.g. the first column 301. The latter has four inputs e1 to e4, corresponding to rows 401 to 404, four outputs s1 to s4 to the inputs of the cells of the following column and a control output 601. In the represented case, where the considered column is controlled by a 0, each of the inputs e1 to e4 is connected to the corresponding output s1 to s4 and the control output 601 is connected to a voltage source corresponding to the binary state 0, e.g. earth. However, if this column of cells is controlled by a 1, all the relays shown pass into the low position, output s4 being connected to a reference voltage corresponding to state 0, e.g. earth, output s3 being connected to input e4, output s2 to input e3, output s1 to input e2 and control output 601 to input e1.

FIG. 4 shows an embodiment of a column of cells according to the invention using MOS transistors T1 to T4 and T'1 to T'4. MOS transistors T1 to T4 on the one hand and MOS transistors T'1 to T'4 on the other are controlled by complementary signals Q and Q*, signal Q e.g. corresponding to the content of register 20 of FIG. 2. Thus, if the MOS transistors T1 to T4 are conductive, the inputs and outputs of the same rank are connected. However, if the MOS transistors T'1 to T'4 are conductive, the inputs are connected to the lower rank outputs, input e1 being connected to control terminal 601. Moreover, two transistors T5 and T'5 ensure that in certain cases, there are no terminals "in the air". Thus, in the present case, the switching circuit according to the invention only comprises (2P+2)N MOS transistors.

It is pointed out that certain of these cells appearing in the switching circuit of FIG. 2 can be eliminated, particularly the three last cells (or upper cells) of the final column 308, the two last cells of the penultimate column 307 and the last cell of the second from last column 306. In general terms, it is possible to eliminate P−1 cells of the last column, P−2 cells of the preceding columns, P−3 cells of the preceding column and so on. Thus, as there are in all P level drops as from the $(N-P+1)^{ith}$ column, it is certain that a level drop has already taken place. The upper cell of this column is consequently unnecessary and so on for the following columns. Nevertheless, in certain cases, in order to simplify the automatic construction of the masks corresponding to the implantation of the integrated circuit, preference is given to retaining these useless cells.

FIG. 5 illustrates the case where the present invention can be used in a particularly interesting manner, namely in a graphic colour display. In such a display, a controller 80 supplies indicative signals of a screen scan or sweep and of addressing a page memory. Page memory 81 contains information corresponding to the colour of each point of the screen. It is therefore a large size memory, e.g. having 80,000 locations. The content of each sequentially addressed location is transmitted to an interpreter 82, which supplies, for the addressed point corresponding to the present scanning instant, information on the proportion, or the presence or absence of informations R, V, B (red, green, blue) for the three guns of the colour display. It is possible to obtain eight colours on the screen, if each of the guns can be excited at one or other of the two values. Thus, for storing one or other of these eight informations, the page memory must normally contain three bits per location.

In order to reduce the size of this memory, it is desirable e.g. to have only two bits per location, which reduces the size of the page memory by a third, but this obviously limits the possibility of colour choice to four. It has been proposed to subdivide the page or screen into windows, e.g. of size 5×10 elementary pitches or steps, whilst including only four colours in each window. Provided that a window memory 83 is provided, which indicates for each scanning instant which group of four colours has been chosen, only two informations per location are then stored in the page memory. Typically, interpreter 82 is a circuit according to the invention, the window memory supplying at all times the content of the image register 20 of FIGS. 1 and 2 and the page memory supplying the content of register 50 of FIG. 2. With the simple switching circuit according to the invention, the saving of a third of the capacity of the page memory, i.e. essentially 80,000 memory points, is of particular interest in view of the small member of additional components required and in view of the fact that these additional components can be realised in an integrated circuit by conventional means.

Although the present invention has only been described in the case where P=4 and where N=8, it obviously applies to random values of P and N, provided that P is equal to or less than N. Moreover, although a particular application of the invention has been described, it can obviously apply to numerous other informatics systems.

What is claimed is:

1. A decoder for selecting a data belonging to a subgroup of P data, said subgroup of P data being part of a group of N data, P being a number lower than N, said decoder comprising a first register with N locations, each location corresponding to a respective data, and each location being given a repective binary state indicating whether the data corresponding to this location is part of the subgroup including the data to be selected; a second register with P locations, each location of said second register corresponding to a respective position of a data among a sugbroup of P data, and each location of said second register being given a respective binary state corresponding to whether or not the respective position corresponds to the position of the data to be selected; a switching array having P rows and N columns, each row corresponding to a respective location of said second register and each column corresponding to a respective location of said first register, with a switching cell at each intersection of a row and a column, each cell comprising a control input a signal input and two signal outputs, the first signal output of one cell being connected to the signal input of an adjacent cell belonging to the same row as said one cell and to the next adjacent column, the second signal output of said one cell being connected to the signal input of an adjacent cell belonging to the next adjacent row and to the next adjacent column, except for the cells of the last row which have their second signal output connected to a respective output terminal of the array; the control input of the cells of a same column being connected to a location corresponding to said column in said first register; the signal input of a cell which is at the intersection of the first column and of a given row being connected to a location corresponding to said given row in said second register, whereby the position of said selected data in said group of N data appear as a specific binary state on one out of N terminals of said array.

2. A decoder according to claim 1, wherein each cell is constituted by a relay having one input and two outputs.

3. A decoder according to claim 1, wherein each cell comprises two MOS transistors controlled by complementary signals, one of these transistors being connected to the input of the following cell of the same rank and the other of said transistors being connected to the input of the following cell of a lower rank.

* * * * *